(12) United States Patent
Hsu et al.

(10) Patent No.: US 11,652,037 B2
(45) Date of Patent: May 16, 2023

(54) SEMICONDUCTOR PACKAGE AND METHOD OF MANUFACTURE

(71) Applicant: Taiwan Semiconductor Manufacturing Co., Ltd., Hsinchu (TW)

(72) Inventors: Chia-Kuei Hsu, Hsinchu (TW); Ming-Chih Yew, Hsinchu (TW); Po-Chen Lai, Hsinchu (TW); Shu-Shen Yeh, Taoyuan (TW); Po-Yao Lin, Zhudong Township (TW); Shin-Puu Jeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/139,775

(22) Filed: Dec. 31, 2020

(65) Prior Publication Data

US 2022/0037247 A1 Feb. 3, 2022

Related U.S. Application Data

(60) Provisional application No. 63/059,226, filed on Jul. 31, 2020.

(51) Int. Cl.
*H01L 23/48* (2006.01)
*H01L 23/498* (2006.01)
(Continued)

(52) U.S. Cl.
CPC .... *H01L 23/49838* (2013.01); *H01L 21/4857* (2013.01); *H01L 21/563* (2013.01);
(Continued)

(58) Field of Classification Search
CPC ........... H01L 23/49838; H01L 21/4857; H01L 21/563; H01L 23/49822; H01L 24/16; H01L 24/81; H01L 25/18; H01L 23/49816
See application file for complete search history.

(56) References Cited

U.S. PATENT DOCUMENTS

| 8,361,842 | B2 | 1/2013 | Yu et al. |
| 8,680,647 | B2 | 3/2014 | Yu et al. |

(Continued)

FOREIGN PATENT DOCUMENTS

| KR | 20190049247 A | 5/2019 |
| KR | 20200025477 A | 3/2020 |
| TW | 201635396 A | 10/2016 |

*Primary Examiner* — Nicholas J Tobergte
(74) *Attorney, Agent, or Firm* — Slater Matsil, LLP

(57) ABSTRACT

Semiconductor devices having improved under-bump metallization layouts and methods of forming the same are disclosed. In an embodiment, a semiconductor device includes an IC die; an interconnect structure coupled to the IC die and including a metallization pattern including a via portion extending through a dielectric layer; a second dielectric layer over the dielectric layer opposite the IC die; and a second metallization pattern coupled to the metallization pattern and including a line portion in the dielectric layer and a second via portion extending through the second dielectric layer; and a UBM over the second metallization pattern and the second dielectric layer, the UBM being coupled to the second metallization pattern, a centerline of the via portion and a second centerline of the second via portion being misaligned with a third centerline of the UBM, the centerline and the second centerline being on opposite sides of the third centerline.

20 Claims, 17 Drawing Sheets

(51) Int. Cl.
  *H01L 21/48* (2006.01)
  *H01L 21/56* (2006.01)
  *H01L 23/00* (2006.01)
  *H01L 25/18* (2023.01)
  *H01L 23/538* (2006.01)

(52) U.S. Cl.
  CPC ........ *H01L 23/49822* (2013.01); *H01L 24/16* (2013.01); *H01L 24/81* (2013.01); *H01L 25/18* (2013.01); *H01L 23/49816* (2013.01); *H01L 23/5383* (2013.01); *H01L 2224/16227* (2013.01); *H01L 2224/81192* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,658,300 B2 * | 5/2020 | Kim | H01L 23/5384 |
| 10,770,416 B2 | 9/2020 | Kim et al. | |
| 11,101,144 B2 | 8/2021 | Paek et al. | |
| 11,189,552 B2 | 11/2021 | Lee et al. | |
| 2009/0174084 A1 * | 7/2009 | Jadhav | H01L 24/05 257/786 |
| 2010/0295174 A1 * | 11/2010 | Ozawa | H01L 24/17 257/737 |
| 2011/0291288 A1 | 12/2011 | Wu et al. | |
| 2012/0032322 A1 | 2/2012 | Lin et al. | |
| 2013/0026468 A1 | 1/2013 | Yoshimuta et al. | |
| 2013/0062760 A1 * | 3/2013 | Hung | H01L 23/5389 257/738 |
| 2013/0062761 A1 | 3/2013 | Lin et al. | |
| 2013/0062775 A1 * | 3/2013 | Ryan | H01L 24/06 257/E23.068 |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0048500 A1 * | 2/2015 | Yu | H01L 24/81 257/737 |
| 2015/0255426 A1 * | 9/2015 | Son | H01L 23/562 257/738 |
| 2019/0164860 A1 * | 5/2019 | Lin | H01L 23/49827 |
| 2020/0035625 A1 * | 1/2020 | Wang | H01L 23/49827 |
| 2020/0105544 A1 | 4/2020 | Tsai et al. | |
| 2020/0105730 A1 * | 4/2020 | Tai | H01L 24/19 |
| 2020/0135653 A1 | 4/2020 | Tsai et al. | |
| 2021/0407904 A1 * | 12/2021 | Liang | H01L 21/6835 |

* cited by examiner

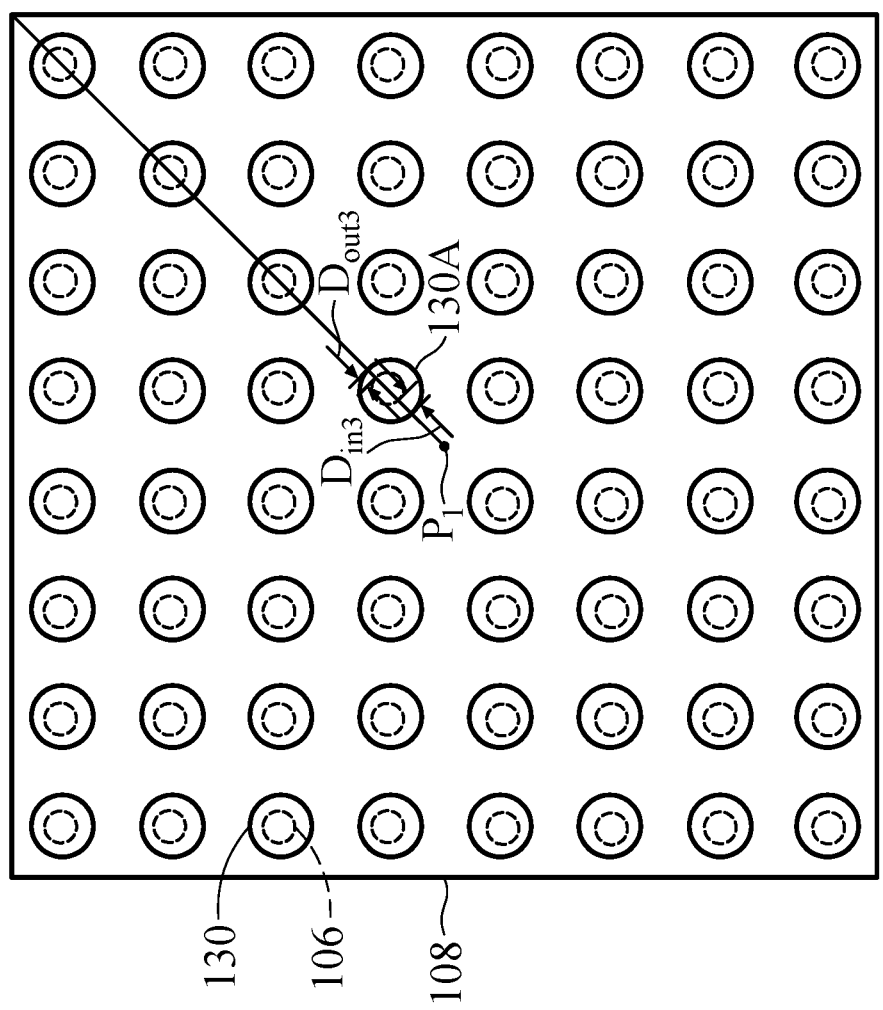

SEMICONDUCTOR PACKAGE AND METHOD OF MANUFACTURE

PRIORITY CLAIM AND CROSS-REFERENCE

This application claims the benefit of U.S. Provisional Application No. 63/059,226, filed on Jul. 31, 2020, and entitled "Semiconductor Package," which application is hereby incorporated herein by reference.

BACKGROUND

The semiconductor industry has experienced rapid growth due to ongoing improvements in the integration density of a variety of electronic components (e.g., transistors, diodes, resistors, capacitors, or the like). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is package-on-package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6B through 6I illustrate cross-sectional and top-down views of under-bump metallization layouts, in accordance with some embodiments.

DETAILED DESCRIPTION

Figure 1:
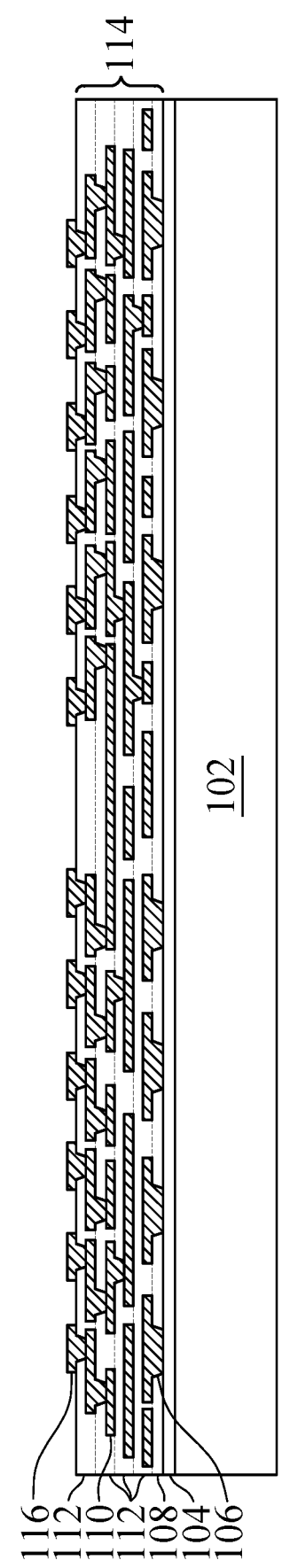
FIGS. 1, 2A-2B, 3, 4, 5 and 6A and 7 through 9 illustrate cross-sectional views of intermediate steps during processes for forming package components, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide packaged semiconductor devices having improved under-bump metallization (UBM) layouts and methods of forming the same. An interconnect structure may be formed including metallization patterns disposed in dielectric layers. A top metallization pattern of the interconnect structure may include via portions extending through a top dielectric layer of the interconnect structure. The UBMs may be formed over the top metallization pattern and the top dielectric layer such that centerlines of the UBMs are offset from or misaligned with centerlines of the via portions of the top metallization pattern. Misaligning the centerlines of the UBMs with the centerlines of the via portions may reduce stress in the surrounding dielectric layers, reducing cracking in the dielectric layers, and reducing device defects.

FIG. 1 illustrates an interconnect structure 114 (also referred to as a redistribution structure) formed over a carrier substrate 102, in accordance with some embodiments. In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

The interconnect structure 114 is formed over the release layer 104 and the carrier substrate 102. The interconnect structure 114 includes dielectric layers 108 and 112 and metallization patterns 106 and 110. The metallization patterns 106 and 110 may also be referred to as redistribution layers or redistribution lines. The interconnect structure 114 is illustrated as including four layers of the metallization patterns 106 and 110 and five layers of the dielectric layers 108 and 112. However, in some embodiments, more or fewer of the dielectric layers 108 and 112 and the metallization patterns 106 and 110 may be formed in the interconnect structure 114. If fewer of the dielectric layers 108 and 112 and the metallization patterns 106 and 110 are to be formed, steps and process discussed below may be omitted. If more of the dielectric layers 108 and 112 and the metallization patterns 106 and 110 are to be formed, steps and processes discussed below may be repeated.

In FIG. 1, the dielectric layer 108 is deposited on the release layer 104. In some embodiments, the dielectric layer 108 is formed of a photo-sensitive material such as PBO, polyimide, BCB, or the like, which may be patterned using a lithography mask. The dielectric layer 108 may be formed by spin coating, lamination, chemical vapor deposition (CVD), the like, or a combination thereof. The dielectric layer 108 is then patterned. The patterning forms openings exposing portions of the release layer 104. The patterning may be by an acceptable process, such as by exposing and developing the dielectric layer 108 to light when the dielectric layer 108 is a photo-sensitive material, or by etching using an anisotropic etch or the like.

The metallization pattern 106 is then formed. The metallization pattern 106 includes conductive elements extending along the major surface of the dielectric layer 108 and extending through the dielectric layer 108 to physically contact the release layer 104. The metallization pattern 106 may be formed by depositing a seed layer (not separately illustrated) over the dielectric layer 108 and in the openings extending through the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 106. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The combination of the conductive material and underlying portions of the seed layer form the metallization pattern 106. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layers 112 and the metallization patterns 110 are then alternately formed over the dielectric layer 108 and the metallization pattern 106. The dielectric layers 112 may be formed of materials and by processes similar to or the same as those described above for the dielectric layer 108. The metallization patterns 110 may be formed of materials and by processes similar to or the same as those described above for the metallization pattern 106.

UBMs 116 are then formed over a topmost dielectric layer 112 and a topmost metallization pattern 110 of the interconnect structure 114. The UBMs 116 may be used for external connection to the interconnect structure 114. The UBMs 116 may include bump portions on and extending along a major surface of the topmost dielectric layer 112 and via portions extending through the topmost dielectric layer 112. The via portions may be in physical contact with and electrically coupled to the topmost metallization pattern 110. The UBMs 116 may be formed of materials and by processes similar to or the same as those described above for the metallization pattern 106. In some embodiments, the UBMs 116 may have different sizes from the metallization patterns 106 and 110.

Figure 2A:
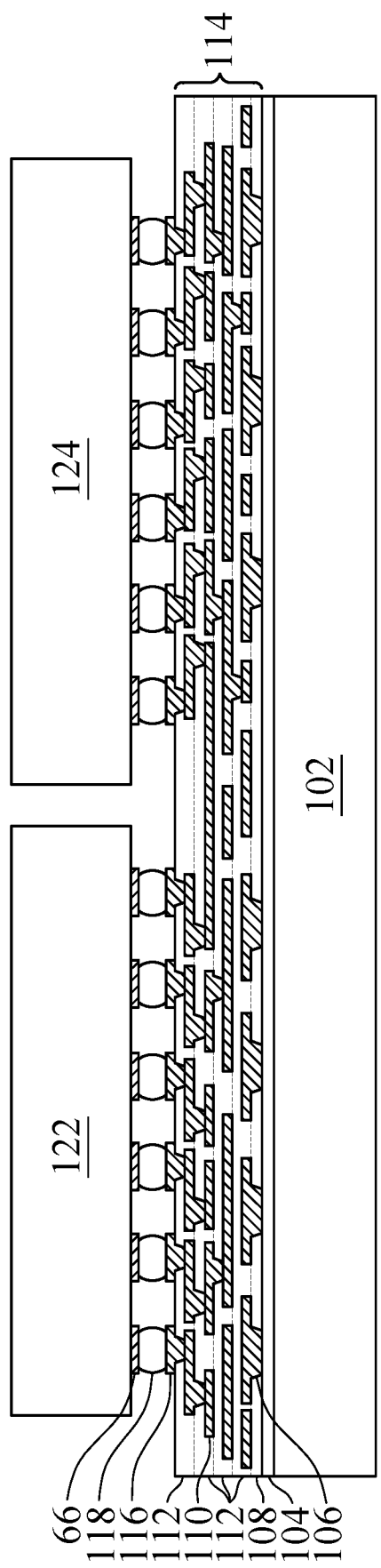

In FIG. 2A, a first integrated circuit die 122 and a second integrated circuit die 124 are bonded to the interconnect structure 114 through conductive connectors 118. The conductive connectors 118 are formed over the UBMs 116. The conductive connectors 118 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 118 may include a conductive material such as solder, copper, aluminum, gold, nickel, silver, palladium, tin, the like, or a combination thereof. In some embodiments, the conductive connectors 118 are formed by initially forming a layer of solder through evaporation, electroplating, printing, solder transfer, ball placement, or the like. Once the layer of solder has been formed, a reflow may be performed in order to shape the material into the desired bump shapes. In some embodiments, the conductive connectors 118 comprise metal pillars (such as copper pillars), which may be formed by sputtering, printing, electroplating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

As illustrated in FIG. 2A, a single first integrated circuit die 122 and a single second integrated circuit die 124 may be coupled to the interconnect structure 114. However, any number of the first integrated circuit dies 122, the second integrated circuit dies 124, and/or other dies, such as more than two dies or less than two dies, may be coupled to the interconnect structure 114. Although the first integrated circuit die 122 and the second integrated circuit die 124 are illustrated as having the same heights, the first integrated circuit die 122 and the second integrated circuit die 124 may having varying heights.

Figure 2B:
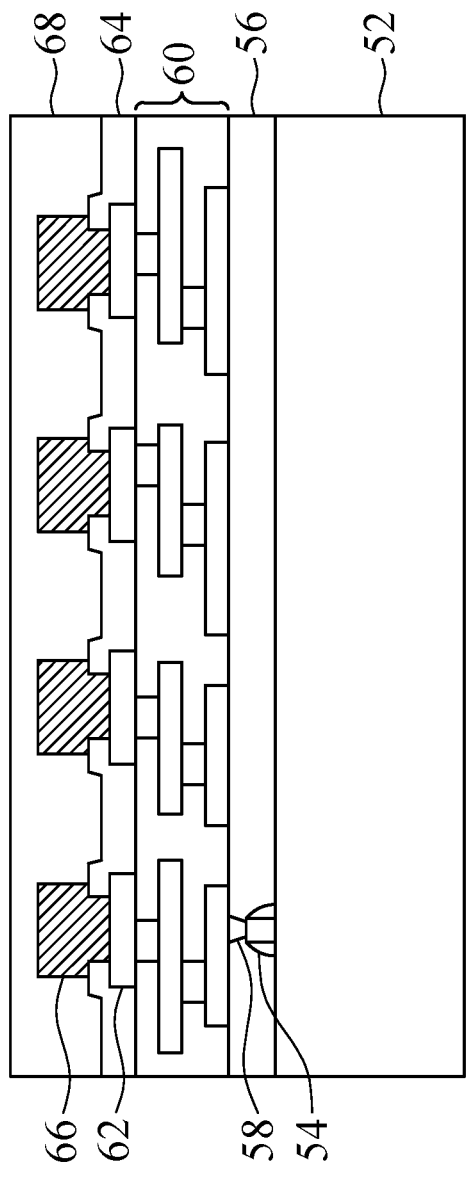

FIG. 2B illustrates a cross-sectional view of an integrated circuit die, which may be used for the first integrated circuit die 122 and/or the second integrated circuit die 124. The integrated circuit die 122/124 will be packaged in subsequent processing to form an integrated circuit package. The integrated circuit die 122/124 may be a logic die (e.g., a central processing unit (CPU), a graphics processing unit (GPU), a system-on-chip (SoC), an application processor (AP), a microcontroller, an application-specific integrated circuit (ASIC) die, or the like), a memory die (e.g., a dynamic random access memory (DRAM) die, a static random access memory (SRAM) die, a high bandwidth memory (HBM) die, or the like), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die), the like, or a combination thereof. In some embodiments, the first integrated circuit die 122 may be an SoC and the second integrated circuit die 124 may be a memory die, such as an HBM die.

The integrated circuit die 122/124 may be formed in a wafer, which may include different device regions that are singulated in subsequent steps to form a plurality of integrated circuit dies. The integrated circuit die 122/124 may be processed according to applicable manufacturing processes to form integrated circuits. For example, the integrated circuit die 122/124 includes a semiconductor substrate 52, such as silicon, doped or un-doped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 2B), sometimes called a front side, and an inactive surface (e.g., the surface facing downwards in FIG. 2B), sometimes called a backside.

Devices 54 (represented by a transistor) may be formed at the active surface of the semiconductor substrate 52. The devices 54 may be active devices (e.g., transistors, diodes, or the like), capacitors, resistors, or the like. An inter-layer dielectric (ILD) 56 is over the active surface of the semiconductor substrate 52. The ILD 56 surrounds and may cover the devices 54. The ILD 56 may include one or more dielectric layers formed of materials such as phospho-silicate glass (PSG), boro-silicate glass (BSG), boron-doped phospho-silicate glass (BPSG), un-doped silicate glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 122/124 further includes pads 62, such as aluminum pads, to which external connections are made. The pads 62 are on the active side of the integrated circuit die 122/124, such as in and/or on the interconnect structure 60. One or more passivation films 64 are on the integrated circuit die 122/124, such as on portions of the interconnect structure 60 and the pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 122/124.

Optionally, solder regions (e.g., solder balls or solder bumps) may be disposed on the pads 62. The solder balls may be used to perform chip probe (CP) testing on the integrated circuit die 122/124. CP testing may be performed on the integrated circuit die 122/124 to ascertain whether the integrated circuit die 122/124 is a known good die (KGD). Thus, only integrated circuit dies 122/124, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 122/124, such as on the passivation films 64 and the die connectors 66. The dielectric layer 68 laterally encapsulates the die connectors 66, and the dielectric layer 68 is laterally coterminous with the integrated circuit die 122/124. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 122/124. In some embodiments, the die connectors 66 remain buried and are exposed during a subsequent process for packaging the integrated circuit die 122/124. Exposing the die connectors 66 may remove any solder regions that may be present on the die connectors 66.

In some embodiments, the integrated circuit die 122/124 is a stacked device that includes multiple semiconductor substrates 52. For example, the integrated circuit die 122/124 may be a memory device such as a hybrid memory cube (HMC) module, a high bandwidth memory (HBM) module, or the like that includes multiple memory dies. In such embodiments, the integrated circuit die 122/124 includes multiple semiconductor substrates 52 interconnected by through-substrate vias (TSVs). Each of the semiconductor substrates 52 may (or may not) have an interconnect structure 60.

The first integrated circuit die 122 and the second integrated circuit die 124 may be mechanically and electrically bonded to the interconnect structure 114 by way of the die connectors 66, the conductive connectors 118, and the UBMs 116. The first integrated circuit die 122 and the second integrated circuit die 124 may be placed over the interconnect structure 114 and a reflow process may be performed to reflow the conductive connectors 118 and bond the die connectors 66 to the UBMs 116 through the conductive connectors 118.

Figure 3:
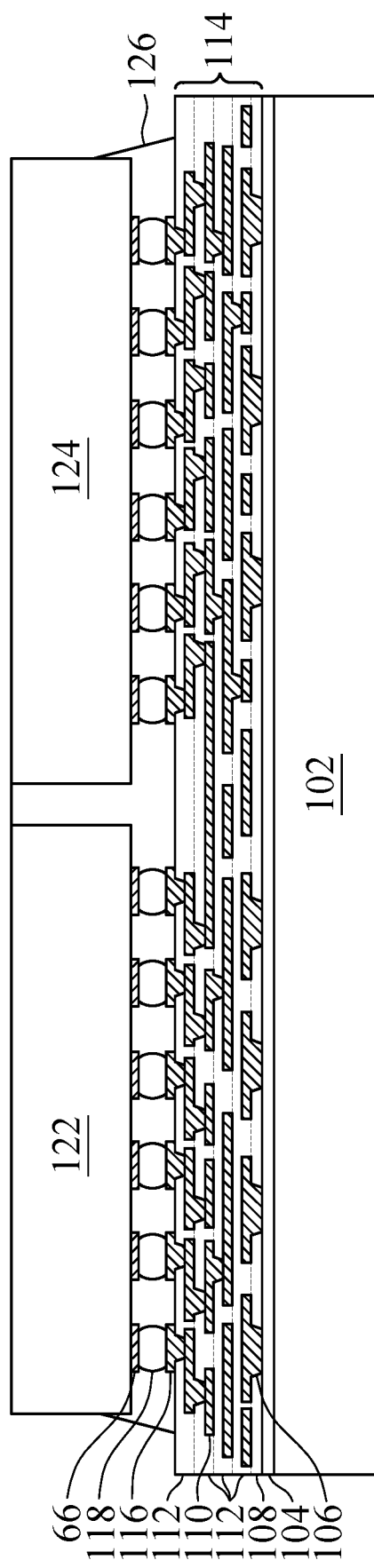

In FIG. 3, an underfill 126 is formed between the first integrated circuit die 122 and the second integrated circuit die 124 and the interconnect structure 114, surrounding the UBMs 116, the conductive connectors 118, and the die connectors 66. The underfill 126 may reduce stress and protect the joints resulting from reflowing the conductive connectors 118. The underfill 126 may be formed by a capillary flow process after the first integrated circuit die 122 and the second integrated circuit die 124 are attached, or may be formed by a suitable deposition method before the first integrated circuit die 122 and the second integrated circuit die 124 are attached. As illustrated in FIG. 3, top surfaces of the underfill 126 may be level with top surfaces of the first integrated circuit die 122 and the second integrated circuit die 124. In some embodiments, top surfaces of the underfill 126 may be disposed below the top surfaces of the first integrated circuit die 122 and the second integrated circuit die 124. Side surfaces of the underfill 126 may extend from side surfaces of the first integrated circuit die 122 and the second integrated circuit die 124 to a top surface of the interconnect structure 114 (e.g., a top surface of the topmost dielectric layer 112).

Figure 4:
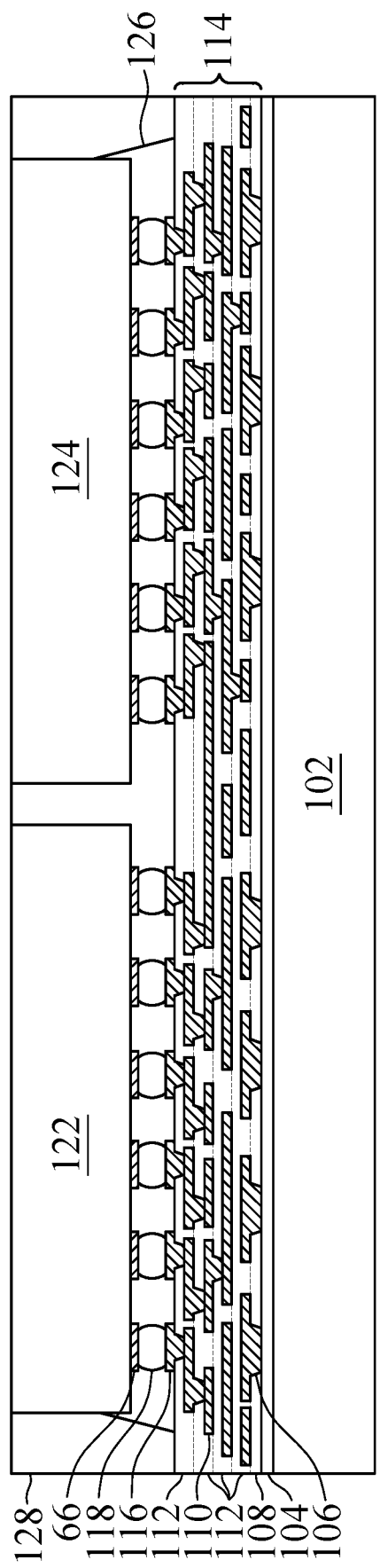

In FIG. 4, an encapsulant 128 is formed over the interconnect structure 114 and the underfill 126 and surrounding the first integrated circuit die 122, the second integrated circuit die 124, and the underfill 126. After formation, the encapsulant 128 encapsulates the first integrated circuit die 122, the second integrated circuit die 124, and the underfill 126. The encapsulant 128 may be a molding compound, epoxy, or the like. The encapsulant 128 may be applied by compression molding, transfer molding, or the like, and may be formed over the interconnect structure 114 such that the first integrated circuit die 122 and/or the second integrated circuit die 124 are buried or covered. In some embodiments, the encapsulant 128 may further be formed in gap regions between the first integrated circuit die 122 and the second integrated circuit die 124. The encapsulant 128 may be applied in liquid or semi-liquid form and then subsequently cured.

A planarization process may be performed on the encapsulant 128 to expose the first integrated circuit die 122 and the second integrated circuit die 124. The planarization process may also expose the underfill 126. The planarization process may remove material of the first integrated circuit die 122, the second integrated circuit die 124, the encapsulant 128 and/or the underfill 126 until the first integrated circuit die 122, the second integrated circuit die 124 and/or the underfill 126 are exposed. Top surfaces of the first integrated circuit die 122, the second integrated circuit die 124, the underfill 126, and the encapsulant 128 may be substantially coplanar (e.g., level) after the planarization process, within process variations. The planarization process may be, for example, a chemical-mechanical polish (CMP), a grinding process, or the like. In some embodiments, the planarization may be omitted, for example, if the first integrated circuit die 122 and/or the second integrated circuit die 124 are already exposed.

Figure 5:
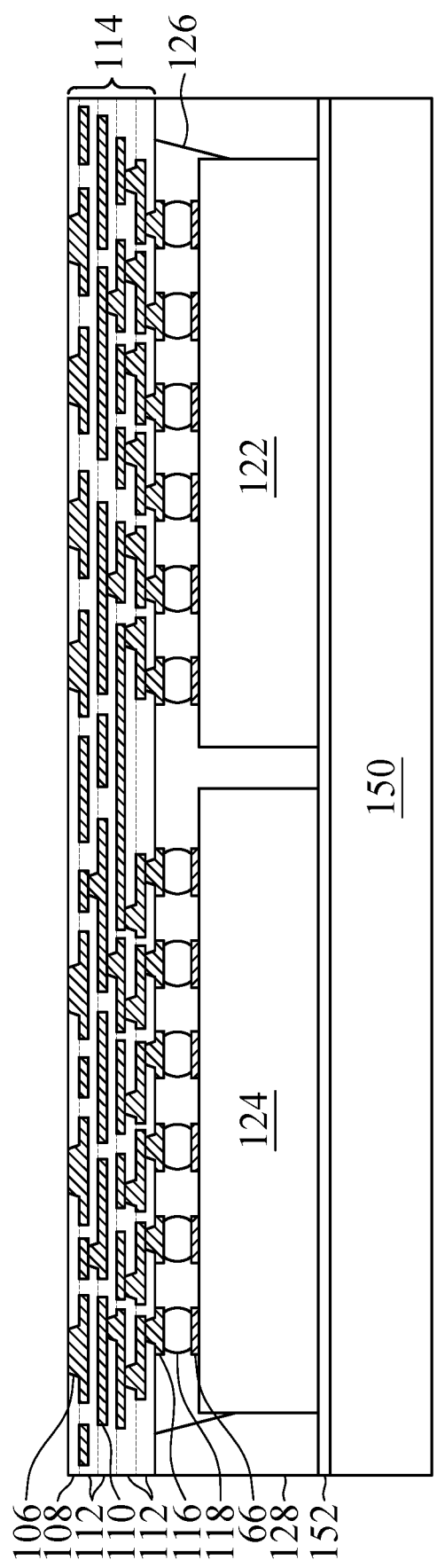

In FIG. 5, a carrier substrate de-bonding is performed to detach (or "de-bond") the carrier substrate 102 from the interconnect structure 114, the device is flipped, and a second carrier substrate 150 is bonded to the first integrated circuit die 122, the second integrated circuit die 124, the underfill 126, and the encapsulant 128. In some embodiments, the de-bonding includes projecting a light, such as a laser light or an UV light, on the release layer 104 so that the release layer 104 decomposes under the heat of the light and the carrier substrate 102 can be removed. As illustrated in FIG. 5, surfaces of the dielectric layer 108 and the metallization pattern 106 may be exposed after removing the carrier substrate 102 and the release layer 104. The device may be flipped such that backsides of the first integrated circuit die 122 and the second integrated circuit die 124 face downwards.

The second carrier substrate 150 may be bonded to the first integrated circuit die 122, the second integrated circuit die 124, the underfill 126, and the encapsulant 128 through a second release layer 152. The second carrier substrate 150 may be a glass carrier substrate, a ceramic carrier substrate, or the like. The second carrier substrate 150 may be a wafer, such that multiple packages can be processed on the second carrier substrate 150 simultaneously. The second release layer 152 may be formed of a polymer-based material, which may be removed along with the second carrier substrate 150 from the overlying structures that will be formed in subsequent steps. In some embodiments, the second release layer 152 is an epoxy-based thermal-release material, which loses its adhesive property when heated, such as a light-to-heat-conversion (LTHC) release coating. In other embodiments, the second release layer 152 may be an ultra-violet (UV) glue, which loses its adhesive property when exposed to UV lights. The second release layer 152 may be dispensed as a liquid and cured, may be a laminate film laminated onto the second carrier substrate 150, or may be the like. The top surface of the second release layer 152 may be leveled and may have a high degree of planarity.

Figure 6A:
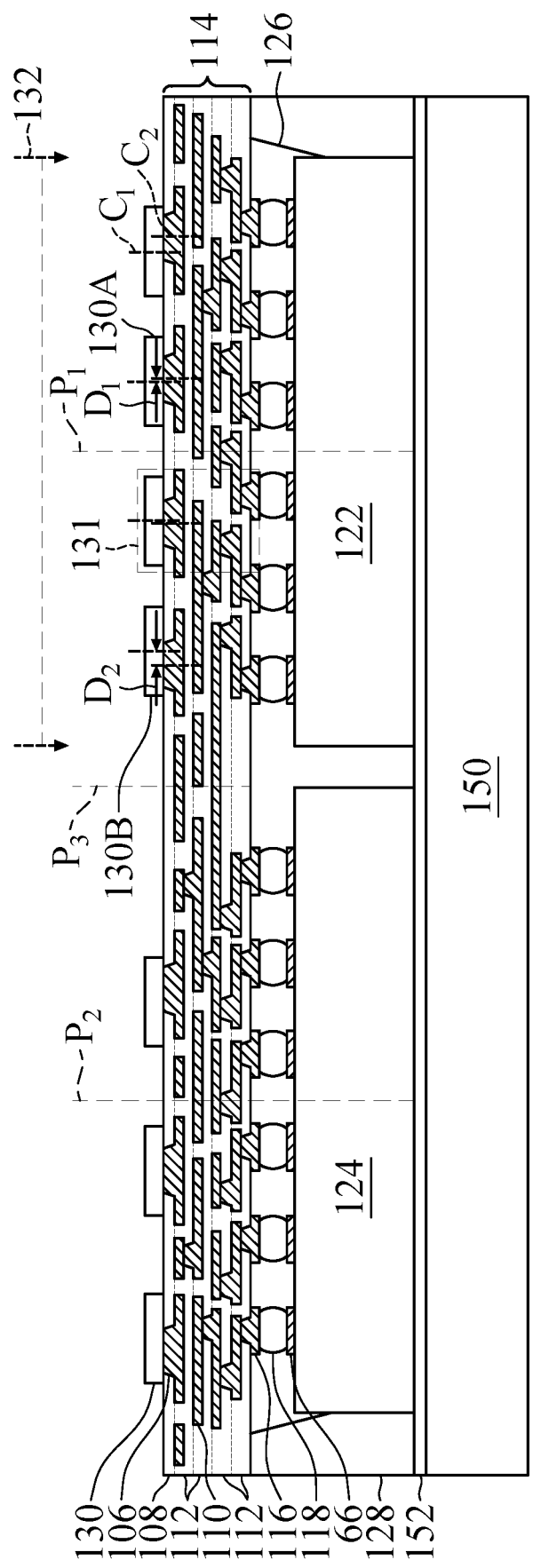
Figure 6B:
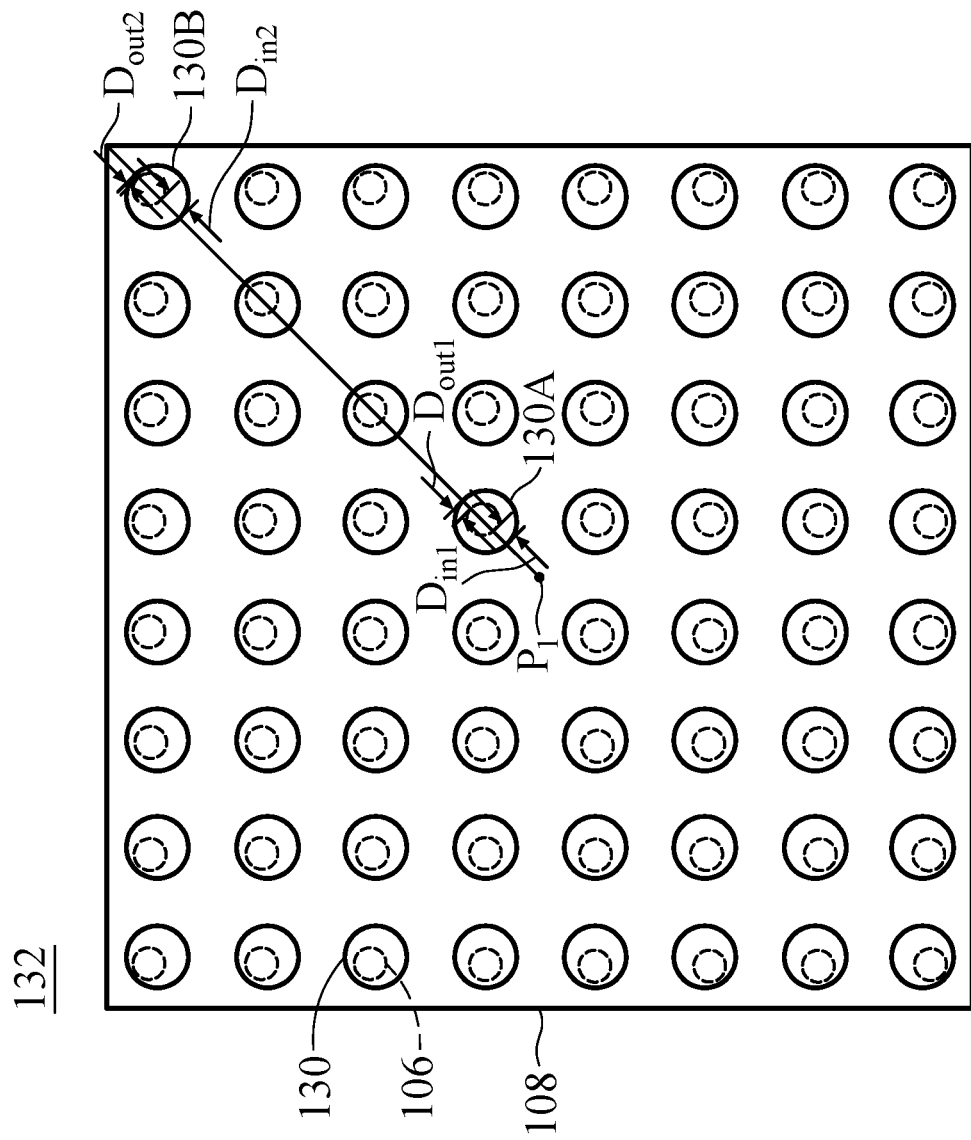
Figure 6D:
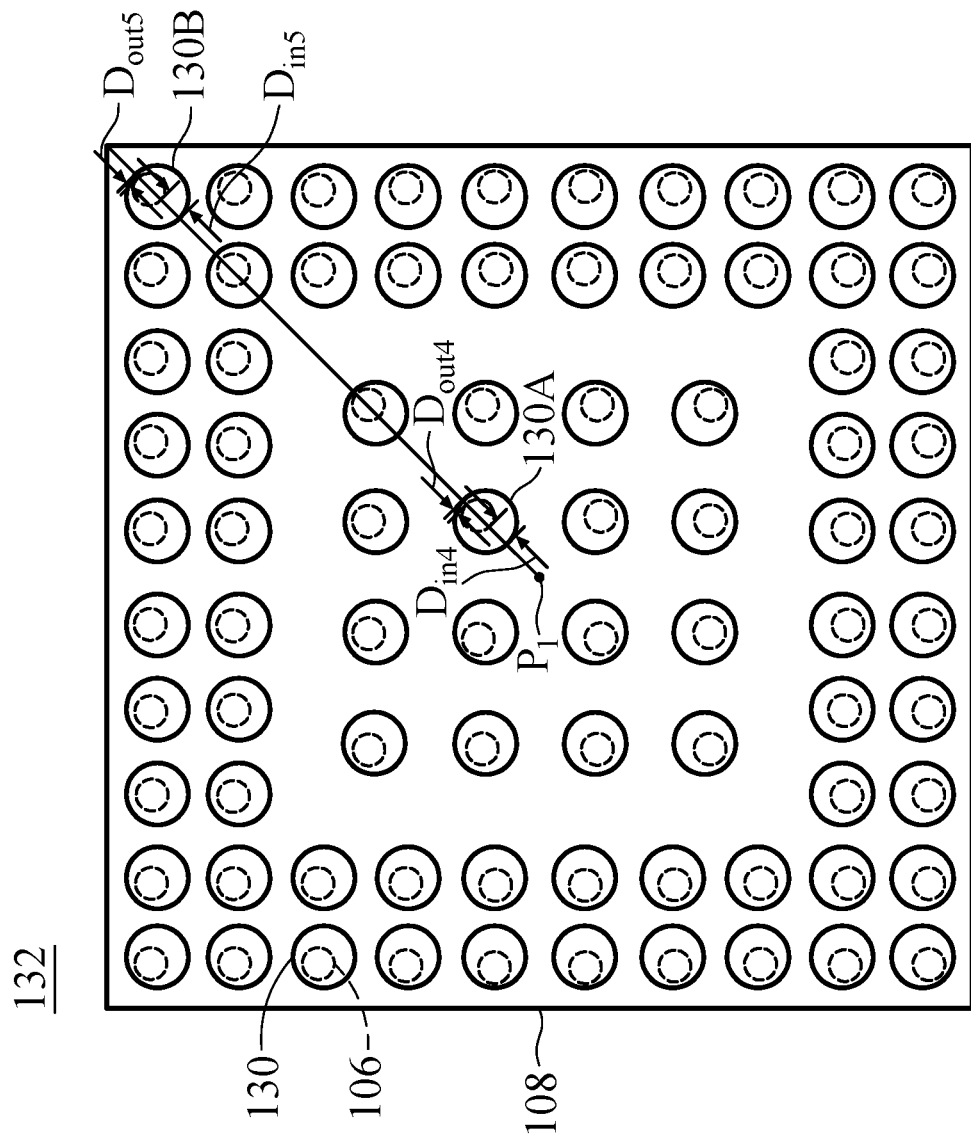
Figure 6E:
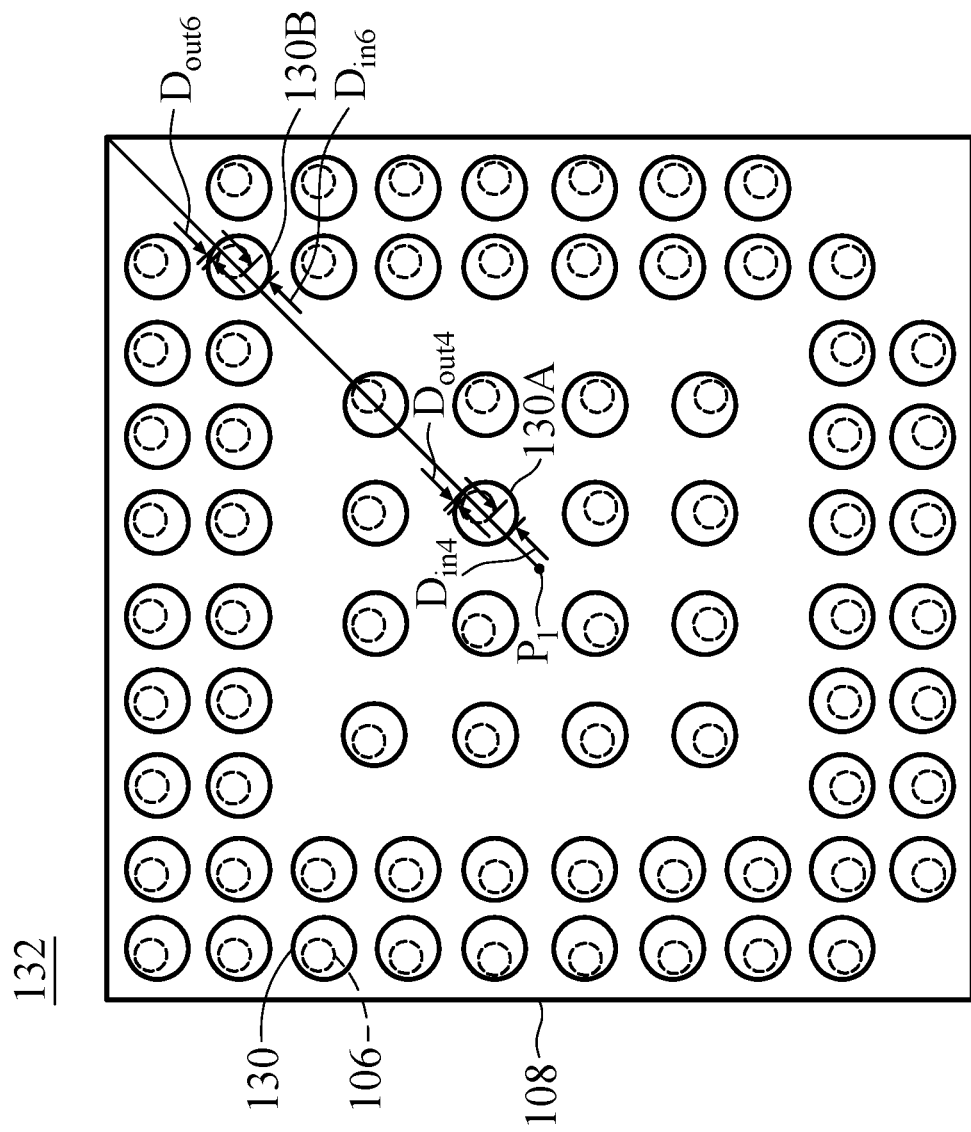
Figures 6F, 6G:
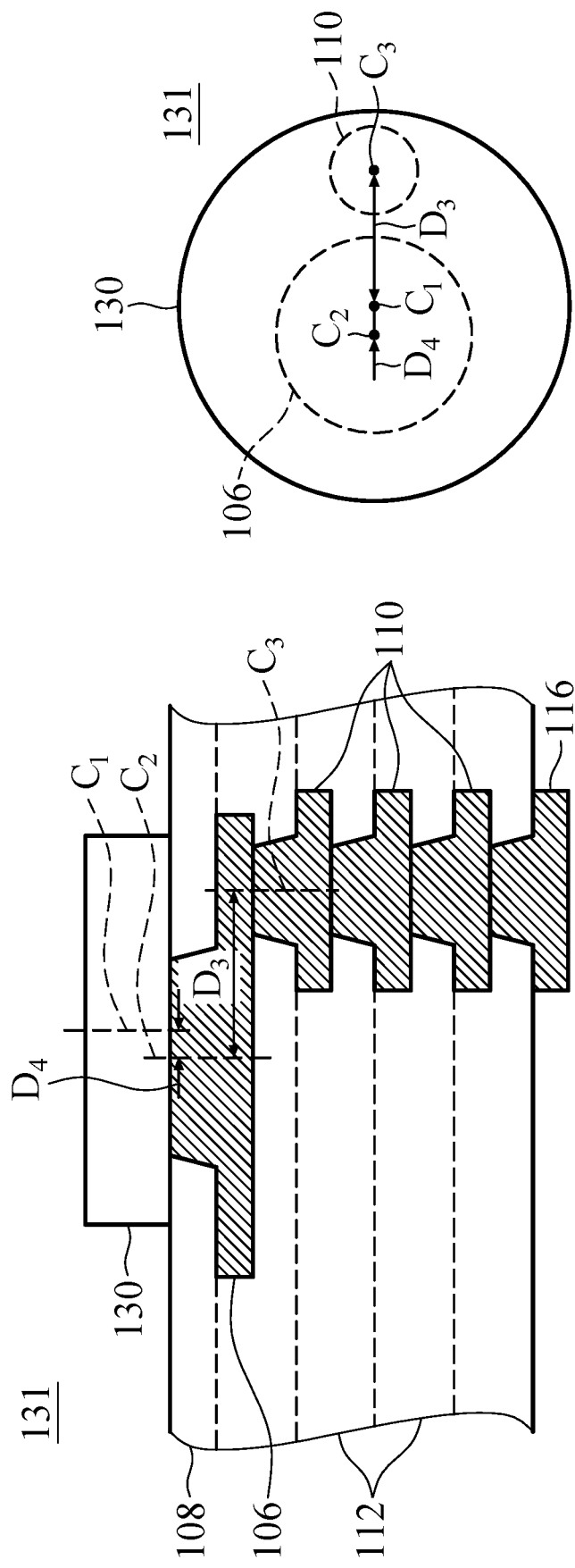
Figure 6H:
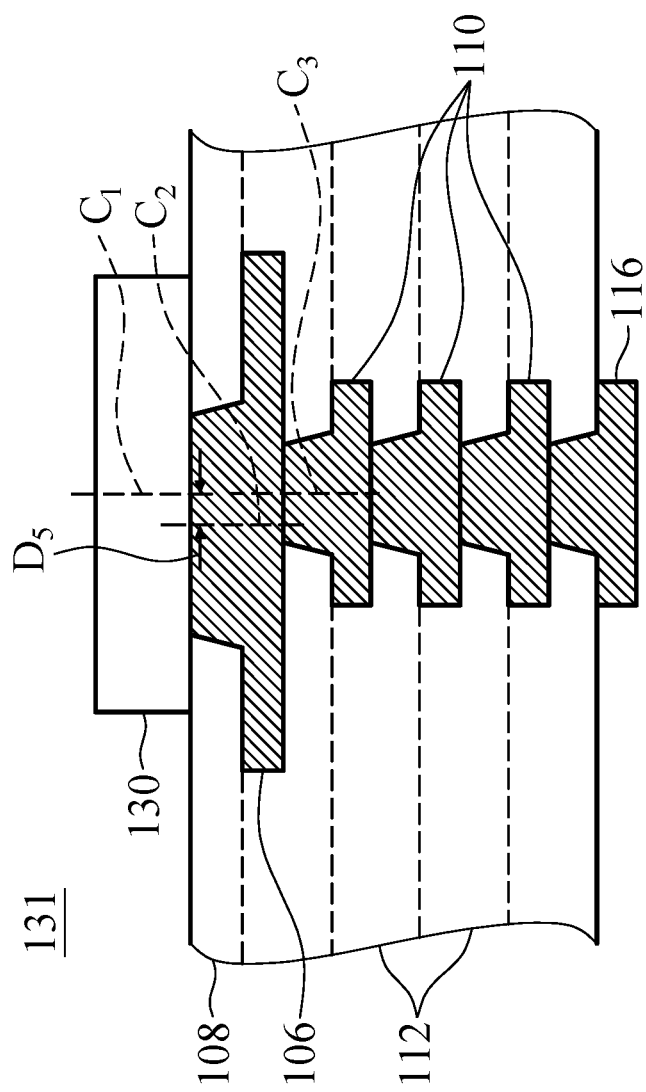
Figure 6I:
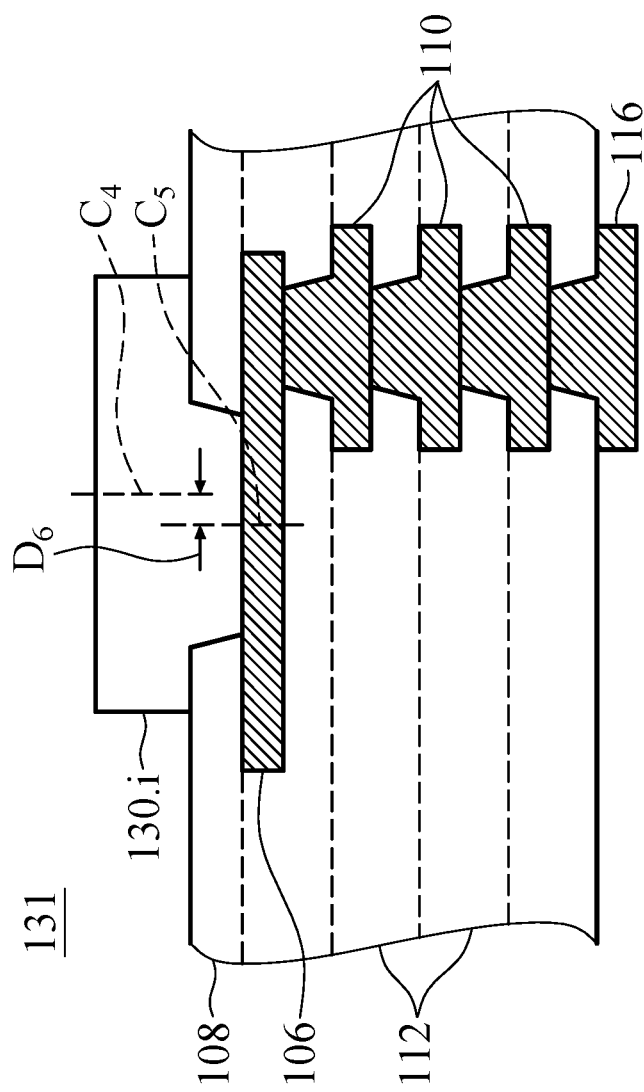

FIGS. 6A through 6I illustrate various views of the device after UBMs 130 are formed over the interconnect structure 114, in accordance with some embodiments. FIGS. 6B through 6E illustrate detailed top-down views of the region 132 of FIG. 6A. The region 132 may be aligned with sidewalls of the first integrated circuit die 122. FIGS. 6F, 6H, and 6I illustrate detailed cross-sectional views of the region 131 of FIG. 6A. FIG. 6G illustrates a detailed top-down view of the region 131 of FIG. 6A.

In FIGS. 6A through 6I, UBMs 130 are formed over the interconnect structure 114. The UBMs 130 may be formed on the metallization pattern 106, extending along surfaces of the dielectric layer 108, and electrically coupled to the metallization pattern 106. The UBMs 130 may be used for external connection to the interconnect structure 114. The UBMs 130 may be formed of materials and by processes similar to or the same as those described above for the metallization pattern 106. In some embodiments, the UBMs 130 may have different sizes from the metallization patterns 106 and 110 and the UBMs 116.

In the embodiments illustrated in FIGS. 6A through 6H, centerlines $C_1$ of the UBMs 130 (e.g., virtual lines extending through the centers of the UBMs 130) may be offset from or misaligned with centerlines $C_2$ of via portions of the metallization pattern 106 (e.g., virtual lines extending through the centers of the via portions of the metallization pattern 106), which via portions extend through the dielectric layer 108. In the embodiment illustrated in FIGS. 6A and 6B, centerlines $C_2$ of the via portions of the metallization pattern 106 are disposed further from a point $P_1$ aligned with a centerline of the first integrated circuit die 122 than the centerlines $C_1$ of the UBMs 130. The likelihood of cracking and other defects occurring between the UBMs 130, the metallization pattern 106, and the dielectric layer 108 may be greatest at edges of the first integrated circuit die 122 and may decrease as a distance from the point P1 decreases. On the other hand, as the distance by which the centerlines $C_1$ of the UBMs 130 are offset from or misaligned with the centerlines $C_2$ of the via portions of the metallization pattern 106 increases, a process window for the UBMs 130 decreases. As such, the distance by which the centerlines $C_1$ of the UBMs 130 are offset from or misaligned with the centerlines $C_2$ of the via portions of the metallization pattern 106 increases as a distance from the point $P_1$ increases. For example, as illustrated in FIG. 6A, a UBM 130A may be closer to the point $P_1$ than a UBM 130B. A distance $D_1$ between the centerline $C_1$ of a UBM 130A and the centerline $C_2$ of a via portion of the metallization pattern 106 may be less than a distance $D_2$ between the centerline $C_1$ of a UBM 130B and the centerline $C_2$ of a via portion of the metallization pattern 106. The distance $D_1$ may range from about 1 μm to about 10 μm and the distance $D_2$ may range from about 5 μm to about 30 μm. This decreases cracking and the like, reduces device defects, improves device performance, and maintains the process window for the UBMs 130.

Referring to FIG. 6B, for a UBM 130A and a metallization pattern 106 closest to the point $P_1$, an inner distance $D_{in1}$ between an edge of the UBM 130A closest to the point $P_1$ and an edge of a via portion of the metallization pattern 106 closest to the point $P_1$ may be greater than an outer distance $D_{out1}$ between an edge of the UBM 130A furthest from the point $P_1$ and an edge of the via portion of the metallization pattern 106 furthest from the point $P_1$. Differences between the inner distance and the outer distance may increase as the distance of the UBM 130 and the metallization pattern 106 from the point $P_1$ increases. For example, for a UBM 130B and a metallization pattern 106 furthest from the point $P_1$, an inner distance $D_{in2}$ between an edge of the UBM 130B closest to the point $P_1$ and an edge of a via portion of the metallization pattern 106 closest to the point $P_1$ may be greater than an outer distance $D_{out2}$ between an edge of the UBM 130B furthest from the point $P_1$ and an edge of the via portion of the metallization pattern 106 furthest from the point $P_1$. Differences between the distance $D_{in2}$ and the distance $D_{out2}$ may be greater than differences between the distance $D_{in1}$ and the distance $D_{in1}$. The differences between the inner distance and the outer distance may range from about 3 μm to about 30 μm. As illustrated in FIG. 6B, the UBMs 130 may be evenly distributed across the surface of the dielectric layer 108 in the region 132.

In the embodiment illustrated in FIG. 6C, an inner distance $D_{in3}$ between an edge of an UBM 130A closest to the point $P_1$ and an edge of a via portion of a metallization pattern 106 closest to the point $P_1$ may be greater than an outer distance $D_{out3}$ between an edge of the UBM 130A furthest from the point $P_1$ and an edge of the via portion of the metallization pattern 106 furthest from the point $P_1$. The inner distances $D_{in3}$, the outer distances $D_{out3}$, and differences between the inner distances and the outer distances may be the same for all of the UBMs 130 and the metallization pattern 106, but the embodiments are not limited thereto. Maintaining consistent inner distances $D_{in3}$, outer distances $D_{out3}$, and differences between the inner distances and the outer distances for the UBMs 130 simplifies layout considerations. The differences between the inner distance and the outer distance may be in a range from about 3 μm to about 30 μm. As illustrated in FIG. 6C, the UBMs 130 may be evenly distributed across the surface of the dielectric layer 108 in the region 132.

In the embodiments illustrated in FIGS. 6D and 6E, differences between the inner distance and the outer distance increase as the distance of the UBM 130 and the metallization pattern 106 from the point $P_1$ increases, similar to the embodiment illustrated in FIGS. 6A and 6B. For example, for a UBM 130A and a metallization pattern 106 closest to the point $P_1$, an inner distance $D_{in4}$ between an edge of the UBM 130A closest to the point $P_1$ and an edge of a via portion of the metallization pattern 106 closest to the point $P_1$ may be greater than an outer distance $D_{out4}$ between an edge of the UBM 130A furthest from the point $P_1$ and an edge of the via portion of the metallization pattern 106 furthest from the point $P_1$. In FIG. 6D, for a UBM 130B and a metallization pattern 106 furthest from the point $P_1$, an inner distance $D_{in5}$ between an edge of the UBM 130B closest to the point $P_1$ and an edge of a via portion of the metallization pattern 106 closest to the point $P_1$ may be greater than an outer distance $D_{out5}$ between an edge of the UBM 130B furthest from the point $P_1$ and an edge of the via portion of the metallization pattern 106 furthest from the point $P_1$. Similarly, in FIG. 6E, for a UBM 130B and a metallization pattern 106 furthest from the point $P_1$, an inner distance $D_{in6}$ between an edge of the UBM 130B closest to the point $P_1$ and an edge of a via portion of the metallization pattern 106 closest to the point $P_1$ may be greater than an outer distance $D_{out6}$ between an edge of the UBM 130B furthest from the point $P_1$ and an edge of the via portion of the metallization pattern 106 furthest from the point $P_1$. Differences between the distance $D_{in5}$ and the distance $D_{out5}$ may be greater than differences between the distance $D_{in4}$ and the distance $D_{out4}$ and differences between the distance $D_{in6}$ and the distance $D_{out6}$ may be greater than differences between the distance $D_{in4}$ and the distance $D_{out4}$. The differences between the inner distance and the outer distance may range from about 3 μm to about 30 μm.

Further in the embodiments illustrated in FIGS. 6D and 6E, the UBMs 130 may be unevenly distributed across the surface of the dielectric layer 108 in the region 132. For example, the UBMs 130 may have a greater density in a peripheral region of the region 132 and a lower density in a central region of the region 132. The embodiment illustrated in FIG. 6E may be the same as the embodiment illustrated in FIG. 6D, except that some of the UBMs 130 are omitted in corner regions of the region 132.

The embodiments illustrated in FIGS. 6B through 6E show and describe layouts of the UBMs 130 and the metallization pattern 106 disposed over the first integrated circuit die 122. In some embodiments, the UBMs 130 and the metallization pattern 106 over the second integrated circuit die 124 may have any of the above-described layouts, with the layout being centered on a point $P_2$ aligned with a centerline of the second integrated circuit die 124 rather than the point $P_1$. In some embodiments, the UBMs 130 and the metallization pattern 106 over the entire interconnect structure 114 may have any of the above-described layouts, with the layout being centered on a point $P_3$ aligned with a centerline of the interconnect structure 114.

Both the UBMs 130 and the metallization pattern 106 may be formed of metals, which may have coefficients of thermal expansion (CTEs) that are mismatched from CTEs of surrounding materials, such as the dielectric layers 108 and 112. Aligning the centerlines $C_2$ of the via portions of the metallization pattern 106 with the centerlines $C_1$ of the UBMs 130 may cause high stress in the resulting structure, resulting in cracking in the dielectric layers 108 and 112. However, by forming the UBMs 130 over the metallization pattern 106 such that the centerlines $C_1$ of the UBMs 130 are offset from or misaligned with the centerlines $C_2$ of the via portions of the metallization pattern 106, stress in the resulting structure is reduced, which reduces the likelihood of cracking and reduces device defects.

In the embodiment illustrated in FIGS. 6F and 6G, centerlines $C_2$ of the via portions of the metallization pattern 106 are disposed opposite centerlines $C_1$ of the UBMs 130 from centerlines $C_3$ of via portions of the metallization pattern 110. The distance $D_4$ between the centerline $C_1$ of a UBM 130 and the centerline $C_2$ of a via portion of the metallization pattern 106 may be the same as the distances $D_1$ or $D_2$ discussed above with respect to FIG. 6A. A distance $D_3$ between the centerline $C_1$ of a UBM 130 and the centerline $C_3$ of a via portion of the metallization pattern 110 may range from about 3 μm to about 30 μm. Similar to the distances between the centerlines $C_1$ of the UBMs 130 and the centerlines $C_2$ of the via portions of the metallization pattern 106, the distances between the centerlines $C_1$ of the UBMs 130 and the centerlines $C_3$ of the via portions of the metallization pattern 110 may increase as a distance from the point $P_1$ increases, or may remain constant with an increasing distance from the point $P_1$. Disposing the centerlines $C_2$ and $C_3$ on opposite sides of the centerline $C_1$ may increase the amount of dielectric material from the dielectric layers 112 between the centerlines $C_2$ and $C_3$, which may further reduce the stress in the resulting structure and reduce device defects.

In the embodiment illustrated in FIG. 6H, the centerlines $C_3$ of via portions of the metallization pattern 110 are aligned with the centerlines $C_1$ of the UBMs 130 and the centerlines $C_2$ of the via portions of the metallization pattern 106 are offset from or misaligned with the centerlines $C_1$ of the UBMs 130 and the centerlines $C_3$ of via portions of the metallization pattern 110. A distance $D_5$ between the centerline $C_2$ of the via portion of the metallization pattern 106 and the centerlines $C_1$ of the UBMs 130 and the centerlines $C_3$ of the via portions of the metallization pattern 110 may be the same as the distances $D_1$ or $D_2$ discussed above with respect to FIG. 6A.

In the embodiment illustrated in FIG. 6I, the UBMs 130 are replaced by UBMs 130.i including via portions extending through the dielectric layer 108. The via portions of the UBMs 130.i may be in physical contact with and electrically coupled to the metallization pattern 106. Via portions of the metallization pattern 106 extending through the dielectric layer 108 may be omitted and openings may be patterned through the dielectric layer 108 after de-bonding the carrier substrate 102 and before forming the UBMs 130.i. The UBMs 130.i may be formed of materials and by processes similar to or the same as those described above for the UBMs 130. The UBMs 130.i may be formed with centerlines $C_4$ of upper portions of the UBMs 130.i disposed above top surfaces of the dielectric layer 108 being offset from or misaligned with centerlines $C_5$ of via portions of the UBMs 130.i disposed below the top surfaces of the dielectric layer 108. A distance $D_6$ between the centerlines $C_4$ of the upper portions of the UBMs 130.i and the centerlines $C_5$ of via portions of the UBMs 130.i may be the same as the distances $D_1$ or $D_2$ discussed above with respect to FIG. 6A.

Both the UBMs 130.i and the metallization pattern 106 may be formed of metals, which may have coefficients of thermal expansion (CTEs) that are mismatched from CTEs of surrounding materials, such as the dielectric layer 108. Aligning the centerlines $C_4$ of the upper portions of the UBMs 130.i and the centerlines $C_5$ of via portions of the UBMs 130.i may cause high stress in the resulting structure, resulting in cracking in the dielectric layer 108. However, by forming the UBMs 130.i such that the centerlines $C_4$ of the upper portions of the UBMs 130.i are offset from or misaligned with the centerlines $C_5$ of via portions of the UBMs 130.i, stress in the resulting structure is reduced, which reduces the likelihood of cracking and reduces device defects.

Figure 7:
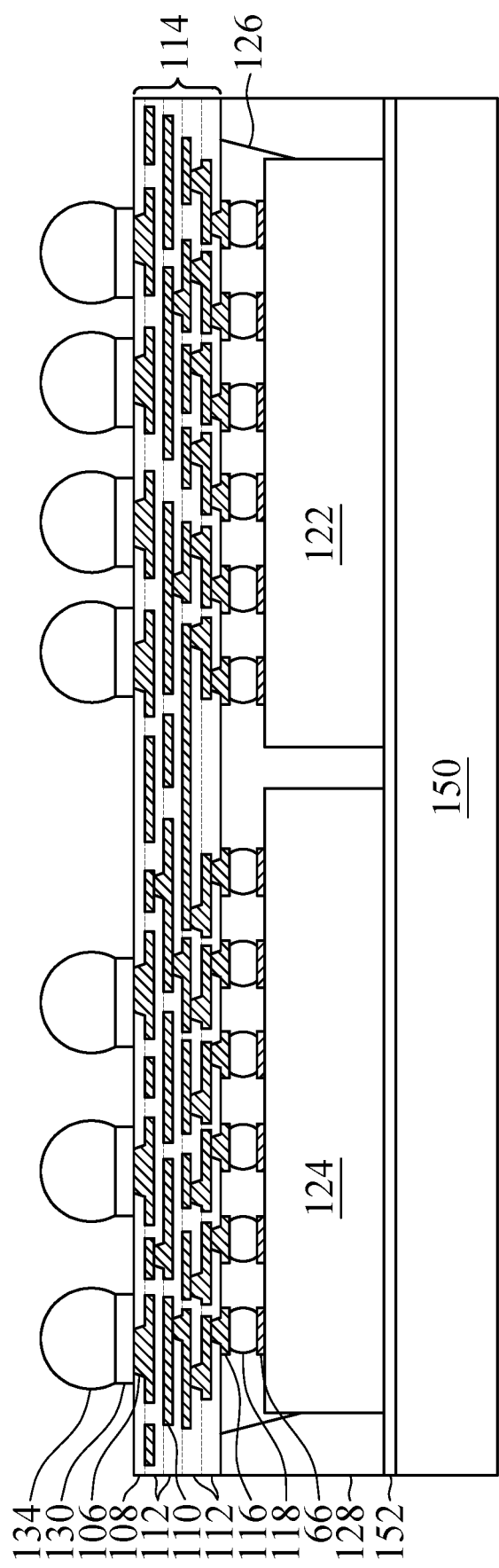

In FIG. 7, conductive connectors 134 are formed over the UBMs 130. The conductive connectors 134 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 134 may include a conductive material such as solder, copper, aluminum, gold, nickel, silver, palladium, tin, the like, or a combination thereof. In some embodiments, the conductive connectors 134 are formed by initially forming a layer of solder through evaporation, electroplating, printing, solder transfer, ball placement, or the like. Once the layer of solder has been formed, a reflow may be performed in order to shape the material into the desired bump shapes. In some embodiments, the conductive connectors 134 comprise metal pillars (such as copper pillars), which may be formed by sputtering, printing, electroplating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 8:
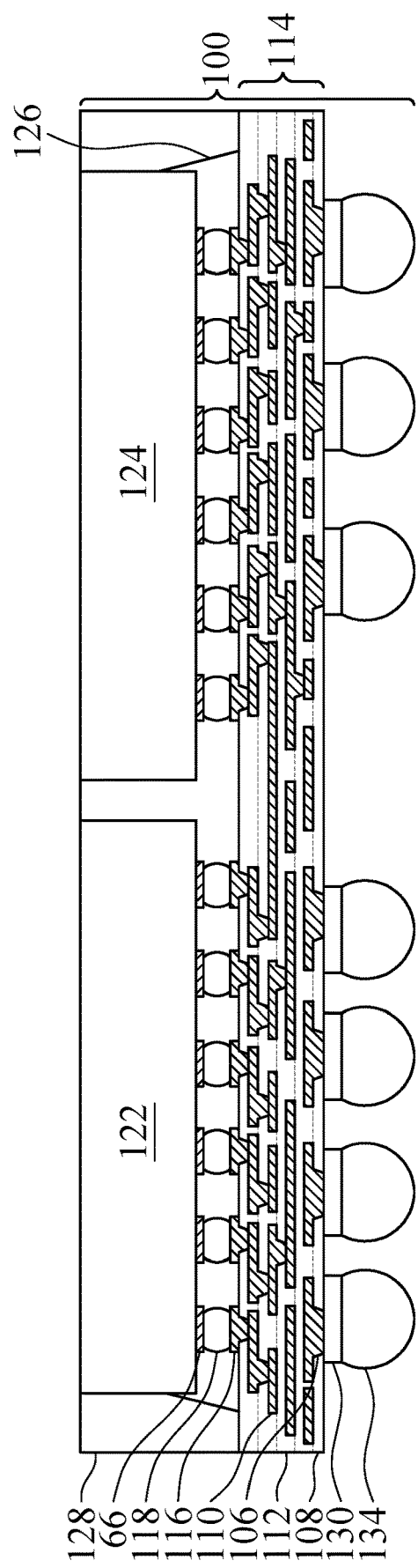

In FIG. 8, a carrier substrate de-bonding is performed to detach (or "de-bond") the second carrier substrate 150 from the first integrated circuit die 122, the second integrated circuit die 124, the underfill 126, and the encapsulant 128 and the device is flipped. In some embodiments, the de-bonding includes projecting a light, such as a laser light or an UV light, on the second release layer 152 so that the second release layer 152 decomposes under the heat of the light and the second carrier substrate 150 can be removed. As illustrated in FIG. 8, surfaces of the first integrated circuit die 122, the second integrated circuit die 124, the underfill 126, and the encapsulant 128 may be exposed after removing the second carrier substrate 150 and the second release layer 152. The device may be flipped such that backsides of the first integrated circuit die 122 and the second integrated circuit die 124 face upwards. After the second carrier substrate 150 and the second release layer 152 are removed, the resulting device may be referred to as a first package component 100.

Figure 9:
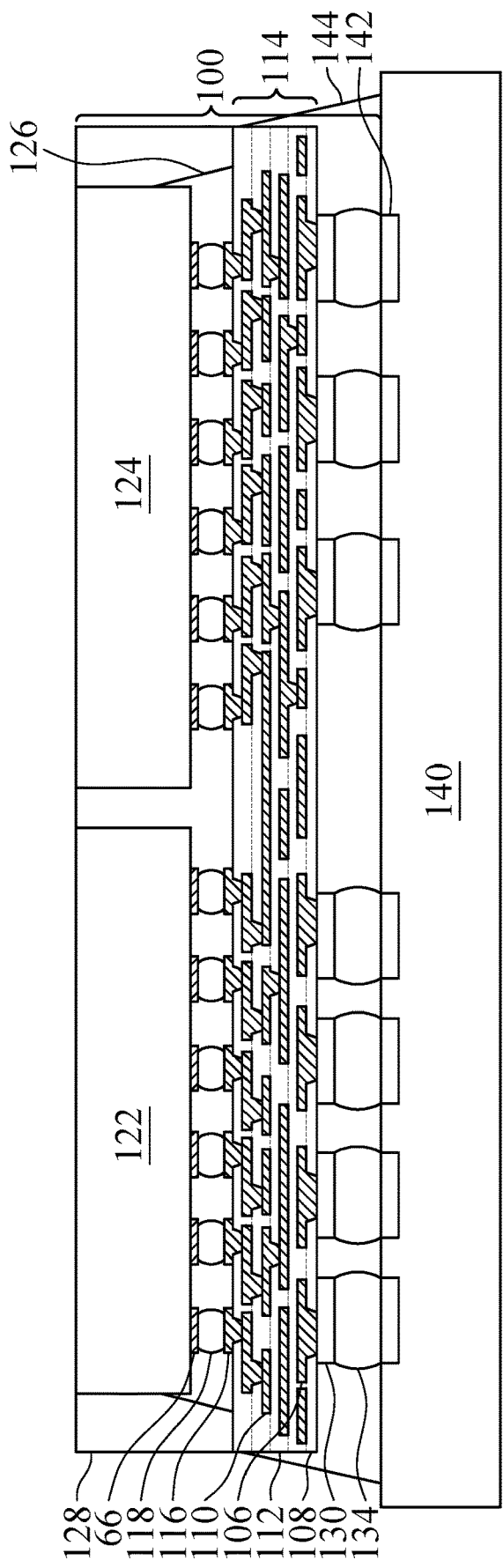

In FIG. 9, a substrate 140 is coupled to the first package component 100. The substrate 140 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 140 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrate 140 may be based on an insulating core such as a fiberglass reinforced resin core. In some embodiments, the core material may be a fiberglass resin such as FR4. In some embodiments, the core material may include bismaleimide-triazine (BT) resin, other printed circuit board (PCB) materials, or other films. Build up films such as Ajinomoto build-up film (ABF) or other laminates may be used for the substrate 140.

The substrate 140 may include active and passive devices (not separately illustrated). A wide variety of devices such as transistors, capacitors, resistors, combinations of these, and the like may be included. The devices may be formed using any suitable methods. The substrate 140 may also include metallization layers (not shown). The metallization layers may be formed over the active and passive devices and are designed to connect the various devices to form functional circuitry. The metallization layers may be formed of alternating layers of dielectric materials (e.g., low-k dielectric materials) and conductive materials (e.g., copper) with vias interconnecting the layers of conductive materials. The metallization layers may be formed through any suitable processes (such as deposition, damascene, dual damascene, or the like). In some embodiments, the substrate 140 is substantially free of active and passive devices.

The substrate 140 may include bond pads 142 formed on a first side of the substrate 140 facing the first package component 100. In some embodiments, the bond pads 142 may be formed by forming recesses (not separately illustrated) into dielectric layers (not separately illustrated) on the first side of the substrate 140. The recesses may be formed to allow the bond pads 142 to be embedded into the dielectric layers. In some embodiments, the recesses are omitted and the bond pads 142 may be formed on the dielectric layers. In some embodiments, the bond pads 142 include a thin seed layer (not separately illustrated) made of copper, titanium, nickel, gold, palladium, the like, or a combination thereof. The conductive materials of the bond pads 142 may be deposited over the thin seed layer. The conductive materials may be formed by an electro-chemical plating process, an electroless plating process, CVD, atomic layer deposition (ALD), PVD, the like, or a combination thereof. In an embodiment, the conductive materials of the bond pads 142 include copper, tungsten, aluminum, silver, gold, the like, or a combination thereof.

In some embodiments, the bond pads 142 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 142. Any suitable materials or layers of materials that may be used for the bond pads 142 are fully intended to be included within the scope of the current application.

The substrate 140 may be mechanically and electrically bonded to the first package component 100 by way of the bond pads 142, the conductive connectors 134, and the UBMs 130. The substrate 140 may be placed over the first package component 100 and a reflow process may be performed to reflow the conductive connectors 134 and bond the bond pads 142 to the UBMs 130 through the conductive connectors 134.

An underfill 144 may then be formed between the first package component 100 and the substrate 140, surrounding the bond pads 142, the UBMs 130, and the conductive connectors 134. The underfill 144 may reduce stress and protect the joints resulting from the reflowing of the conductive connectors 134. The underfill 144 may be formed by a capillary flow process after the first package component 100 is attached to the substrate 140, or may be formed by a suitable deposition method before the first package component 100 is attached.

Embodiments may achieve various advantages. For example, forming UBMs over a metallization pattern such that centerlines of via portions of the metallization pattern are offset from or misaligned with centerlines of the UBMs reduces stress in the resulting structure. This reduces the likelihood of cracks occurring in surrounding dielectric layers, which reduces device defects.

In accordance with an embodiment, a semiconductor device includes a first integrated circuit die; an interconnect structure coupled to the first integrated circuit die, the interconnect structure including a first metallization pattern including a first via portion extending through a first dielectric layer; a second dielectric layer over the first dielectric layer opposite the first integrated circuit die; and a second metallization pattern coupled to the first metallization pattern, the second metallization pattern including a line portion in the first dielectric layer and a second via portion extending through the second dielectric layer; and an under-bump metallization (UBM) over the second metallization pattern and the second dielectric layer, the UBM being coupled to the second metallization pattern, a first centerline of the first via portion and a second centerline of the second via portion being misaligned with a third centerline of the UBM, and the first centerline and the second centerline being on opposite sides of the third centerline. In an embodiment, the semiconductor device further includes a conductive bump coupled to and in physical contact with the UBM. In an embodiment, the semiconductor device further includes a second integrated circuit die coupled to the interconnect structure, the first integrated circuit die including a system on chip, the second integrated circuit die including a high bandwidth memory die. In an embodiment, a distance between the second centerline and the third centerline in a first direction parallel to a major surface of the second dielectric layer is from 3 µm to 30 µm. In an embodiment, the UBM is disposed in a first region having boundaries aligned with sidewalls of the first integrated circuit die, the third centerline is closer to a fourth centerline of the first region than the second centerline. In an embodiment, the semiconductor device further includes a second UBM, the second metallization pattern further including a third via portion extending through the second dielectric layer, the third via portion being coupled to the second UBM, a fifth centerline of the second UBM being disposed further from the fourth centerline of the first region than the third centerline of the UBM, a first distance between the second centerline and the third centerline in a first direction parallel to a major surface of the second dielectric layer being less than a second distance between the fifth centerline and a sixth centerline of the third via portion in the first direction. In an embodiment, the semiconductor device further includes a second UBM, the second metallization pattern further including a third via portion extending through the second dielectric layer, the third via portion being coupled to the second UBM, a fifth centerline of the second UBM being disposed further from the fourth centerline of the first region than the third centerline of the UBM, a first distance between the second centerline and the third centerline in a first direction parallel to a major surface of the second dielectric layer being equal to a second distance between the fifth centerline and a sixth centerline of the third via portion in the first direction.

In accordance with another embodiment, a semiconductor device includes an integrated circuit die coupled to an interconnect structure, the interconnect structure including one or more metallization patterns disposed in one or more dielectric layers; a top dielectric layer over the one or more metallization patterns and the one or more dielectric layers; and a top metallization pattern electrically coupled to the one or more metallization patterns, the top metallization pattern including a via portion extending through the top dielectric layer, a top surface of the via portion being level with a top surface of the top dielectric layer; an under-bump metallization extending along the top surface of the top dielectric layer and the top surface of the via portion of the top metallization pattern, a first distance being measured between an edge of the under-bump metallization closest to a centerline of the integrated circuit die and an edge of the via portion closest to the centerline of the integrated circuit die, a second distance being measured between an edge of the under-bump metallization furthest from the centerline of the integrated circuit die and an edge of the via portion furthest from the centerline of the integrated circuit die, and a first difference between the first distance and the second distance being positive; and a conductive contact coupled to the under-bump metallization. In an embodiment, the integrated circuit die includes a system on chip die. In an embodiment, the semiconductor device further includes a second under-bump metallization extending along the top surface of the top dielectric layer and a top surface of a second via portion of the top metallization pattern, the second under-bump metallization being further from the centerline of the integrated circuit die than the under-bump metallization, a third distance being measured between an edge of the second under-bump metallization closest to the centerline of the integrated circuit die and an edge of the second via portion closest to the centerline of the integrated circuit die, the third distance being greater than the first distance. In an embodiment, the semiconductor device further includes a second under-bump metallization extending along the top surface of the top dielectric layer and a top surface of a second via portion of the top metallization pattern, the second under-bump metallization being further from the centerline of the integrated circuit die than the under-bump metallization, a third distance being measured between an edge of the second under-bump metallization closest to the centerline of the integrated circuit die and an edge of the second via portion closest to the centerline of the integrated circuit die, the third distance being equal to the first distance. In an embodiment, the semiconductor device further includes a plurality of first under-bump metallizations, the first under-bump metallizations includes the under-bump metallization, and the first under-bump metallizations are evenly spaced relative to one another in a region aligned with sidewalls of the integrated circuit die. In an embodiment, the semiconductor device further includes a plurality of first under-bump metallizations, the first under-bump metallizations are disposed in a region aligned with sidewalls of the integrated circuit die, the region includes a first portion surrounded by a second portion, and a density of the first under-bump metallizations in the first portion is less than a density of the first under-bump metallizations in the second portion. In an embodiment, the semiconductor device further includes a plurality of first under-bump metallizations, the first under-bump metallizations are disposed in a region aligned with sidewalls of the integrated circuit die, and the first under-bump metallizations are evenly distributed in the region.

In accordance with yet another embodiment, a method includes forming an interconnect structure over a first carrier; bonding a first die to the interconnect structure; removing the first carrier from the interconnect structure, a first via portion of a first metallization pattern of the interconnect structure opposite the first die being exposed after removing the first carrier; and forming a first UBM over and in physical contact with the first via portion, a centerline of the first UBM being offset from a centerline of the first via portion. In an embodiment, the method further includes forming a first plurality of UBMs and a second plurality of UBMs encircling the first plurality of UBMs, a density of the first plurality of UBMs is less than a density of the second plurality of UBMs, and forming the first plurality of UBMs and the second plurality of UBMs includes forming the first UBM. In an embodiment, the method further includes forming an underfill between the interconnect structure and each of the first die and a second die, the underfill extending to level with top surfaces of the first die and the second die. In an embodiment, the method further includes forming an encapsulant surrounding the first die, the second die, and the underfill; and planarizing the encapsulant, the underfill, the first die, and the second die. In an embodiment, the method further includes forming a second UBM over and in physical contact with a second via portion of the first metallization pattern, a distance between the centerline of the first UBM and a centerline of the first die in a first direction parallel to a major surface of the interconnect structure is less than a distance between a centerline of the second UBM and the centerline of the first die in the first direction, and the centerline of the second UBM is offset from a centerline of the second via portion by a distance greater than a distance that the centerline of the first UBM is offset from the centerline of the first via portion. In an embodiment, the method further includes forming a second UBM over and in physical contact with a second via portion of the first metallization pattern, a distance between the centerline of the first UBM and a centerline of the first die in a first direction parallel to a major surface of the interconnect structure is less than a distance between a centerline of the second UBM and the centerline of the first die in the first direction, and the centerline of the second UBM is offset from a centerline of the second via portion by a distance equal to a distance that the centerline of the first UBM is offset from the centerline of the first via portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
  a first integrated circuit die;
  an interconnect structure coupled to the first integrated circuit die, the interconnect structure comprising:
    a first metallization pattern comprising a first via portion extending through a first dielectric layer;
    a second dielectric layer over the first dielectric layer opposite the first integrated circuit die; and
    a second metallization pattern coupled to the first metallization pattern, the second metallization pattern comprising a line portion in the first dielectric layer and a second via portion extending through the second dielectric layer; and
  an under-bump metallization (UBM) over the second metallization pattern and the second dielectric layer, the UBM being coupled to the second metallization pattern, wherein a first centerline of the first via portion and a second centerline of the second via portion are misaligned with a third centerline of the UBM, and wherein the first centerline and the second centerline are on opposite sides of the third centerline.

2. The semiconductor device of claim 1, further comprising a conductive bump coupled to and in physical contact with the UBM.

3. The semiconductor device of claim 1, further comprising a second integrated circuit die coupled to the interconnect structure, the first integrated circuit die comprising a system on chip, the second integrated circuit die comprising a high bandwidth memory die.

4. The semiconductor device of claim 1, wherein a distance between the second centerline and the third centerline in a first direction parallel to a major surface of the second dielectric layer is from 3 μm to 30 μm.

5. The semiconductor device of claim 1, wherein the UBM is disposed in a first region having boundaries aligned with sidewalls of the first integrated circuit die, wherein the third centerline is closer to a fourth centerline of the first region than the second centerline.

6. The semiconductor device of claim 5, further comprising a second UBM, wherein the second metallization pattern further comprises a third via portion extending through the second dielectric layer, the third via portion being coupled to the second UBM, wherein a fifth centerline of the second UBM is disposed further from the fourth centerline of the first region than the third centerline of the UBM, wherein a first distance between the second centerline and the third centerline in a first direction parallel to a major surface of the second dielectric layer is less than a second distance between the fifth centerline and a sixth centerline of the third via portion in the first direction.

7. The semiconductor device of claim 5, further comprising a second UBM, wherein the second metallization pattern further comprises a third via portion extending through the second dielectric layer, the third via portion being coupled to the second UBM, wherein a fifth centerline of the second UBM is disposed further from the fourth centerline of the first region than the third centerline of the UBM, wherein a first distance between the second centerline and the third centerline in a first direction parallel to a major surface of the second dielectric layer is equal to a second distance between the fifth centerline and a sixth centerline of the third via portion in the first direction.

8. A semiconductor device comprising:
an integrated circuit die coupled to an interconnect structure, the interconnect structure comprising:
one or more metallization patterns disposed in one or more dielectric layers;
a top dielectric layer over the one or more metallization patterns and the one or more dielectric layers; and
a top metallization pattern electrically coupled to the one or more metallization patterns, wherein the top metallization pattern comprises a via portion extending through the top dielectric layer, wherein a top surface of the via portion is level with a top surface of the top dielectric layer;
an under-bump metallization extending along the top surface of the top dielectric layer and the top surface of the via portion of the top metallization pattern, wherein a first distance is measured between an edge of the under-bump metallization closest to a centerline of the integrated circuit die and an edge of the via portion closest to the centerline of the integrated circuit die, wherein a second distance is measured between an edge of the under-bump metallization furthest from the centerline of the integrated circuit die and an edge of the via portion furthest from the centerline of the integrated circuit die, and wherein a first difference between the first distance and the second distance is positive; and
a conductive contact coupled to the under-bump metallization.

9. The semiconductor device of claim 8, wherein the integrated circuit die comprises a system on chip die.

10. The semiconductor device of claim 8, further comprising a second under-bump metallization extending along the top surface of the top dielectric layer and a top surface of a second via portion of the top metallization pattern, the second under-bump metallization being further from the centerline of the integrated circuit die than the under-bump metallization, wherein a third distance is measured between an edge of the second under-bump metallization closest to the centerline of the integrated circuit die and an edge of the second via portion closest to the centerline of the integrated circuit die, wherein the third distance is greater than the first distance.

11. The semiconductor device of claim 8, further comprising a second under-bump metallization extending along the top surface of the top dielectric layer and a top surface of a second via portion of the top metallization pattern, the second under-bump metallization being further from the centerline of the integrated circuit die than the under-bump metallization, wherein a third distance is measured between an edge of the second under-bump metallization closest to the centerline of the integrated circuit die and an edge of the second via portion closest to the centerline of the integrated circuit die, wherein the third distance is equal to the first distance.

12. The semiconductor device of claim 8, further comprising a plurality of first under-bump metallizations, wherein the first under-bump metallizations comprise the under-bump metallization, and wherein the first under-bump metallizations are evenly spaced relative to one another in a region aligned with sidewalls of the integrated circuit die.

13. The semiconductor device of claim 8, further comprising a plurality of first under-bump metallizations, wherein the first under-bump metallizations are disposed in a region aligned with sidewalls of the integrated circuit die, wherein the region comprises a first portion surrounded by a second portion, and wherein a density of the first under-bump metallizations in the first portion is less than a density of the first under-bump metallizations in the second portion.

14. The semiconductor device of claim 8, further comprising a plurality of first under-bump metallizations, wherein the first under-bump metallizations are disposed in a region aligned with sidewalls of the integrated circuit die, and wherein the first under-bump metallizations are evenly distributed in the region.

15. A semiconductor device comprising:
an interconnect structure comprising a first metallization pattern, the first metallization pattern comprising a first via portion adjacent a first surface of the interconnect structure;
a first die on the interconnect structure opposite the first via portion, the first die having a centermost portion when viewed from a plan view; and
a first under-bump metallurgy (UBM) overlying the first die and being on and in physical contact with the first via portion, wherein a centerline of the first UBM is offset from a centerline of the first via portion, and further wherein a centermost portion of the first UBM, when viewed from a plan view is first distance from the centermost portion of the first die, a centermost portion of the first via portion, when viewed from a plan view, is a second distance from the centermost portion of the first die, and the first distance is greater than the second distance.

16. The semiconductor device of claim 15, further comprising
a first plurality of UBMs, the first plurality of UBMs comprising the first UBM; and
a second plurality of UBMs encircling the first plurality of UBMs, wherein a density of the first plurality of UBMs is less than a density of the second plurality of UBMs.

17. The semiconductor device of claim 15, further comprising
a second die on the interconnect structure adjacent the first die; and
an underfill between the interconnect structure and each of the first die and a second die, the underfill extending to level with surfaces of the first die and the second die opposite the interconnect structure.

18. The semiconductor device of claim 17, further comprising:
an encapsulant surrounding the first die, the second die, and the underfill, wherein surfaces of the encapsulant, the underfill, the first die, and the second die opposite the interconnect structure are level with one another.

19. The semiconductor device of claim 15, further comprising:
a second UBM on and in physical contact with a second via portion of the first metallization pattern, wherein a distance between the centerline of the first UBM and a centerline of the first die in a first direction parallel to a major surface of the interconnect structure is less than a distance between a centerline of the second UBM and the centerline of the first die in the first direction, and wherein the centerline of the second UBM is offset from a centerline of the second via portion by a distance greater than a distance that the centerline of the first UBM is offset from the centerline of the first via portion.

20. The semiconductor device of claim 15, further comprising:
a second UBM on and in physical contact with a second via portion of the first metallization pattern, wherein a distance between the centerline of the first UBM and a centerline of the first die in a first direction parallel to a major surface of the interconnect structure is less than a distance between a centerline of the second UBM and the centerline of the first die in the first direction, and wherein the centerline of the second UBM is offset from a centerline of the second via portion by a distance equal to a distance that the centerline of the first UBM is offset from the centerline of the first via portion.

* * * * *